(12) United States Patent
Matsuno (10) Patent No.: US 7,800,155 B2
(45) Date of Patent: Sep. 21, 2010

(54) SEMICONDUCTOR DEVICE (75) Inventor: Koichi Matsuno, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 194 days.

(21) Appl. No.: 11/858,585

(22) Filed: Sep. 20, 2007

(65) Prior Publication Data
US 2008/0246075 A1   Oct. 9, 2008

(30) Foreign Application Priority Data
Sep. 20, 2006   (JP) ............... 2006-254385

(51) Int. Cl.
*H01L 27/115* (2006.01)
(52) U.S. Cl. ................ 257/315; 257/314; 257/E21.666
(58) Field of Classification Search ................. 257/314, 257/E21.666, 315
See application file for complete search history.

(56) References Cited

U.S. PATENT DOCUMENTS

| | | | |
|---|---|---|---|
| 6,720,612 B2 | 4/2004 | Takeuchi et al. | |
| 6,784,041 B2 * | 8/2004 | Takeuchi et al. | 438/201 |
| 6,818,511 B2 * | 11/2004 | Lee | 438/266 |
| 6,828,624 B1 | 12/2004 | Goda et al. | |
| 6,894,341 B2 | 5/2005 | Sugimae et al. | |
| 7,078,813 B2 | 7/2006 | Sakuma et al. | |
| 7,535,052 B2 * | 5/2009 | Kwon et al. | 257/315 |
| 7,683,421 B2 * | 3/2010 | Buh et al. | 257/314 |
| 2002/0047138 A1 * | 4/2002 | Watanabe et al. | 257/230 |
| 2006/0038218 A1 | 2/2006 | Yaegashi et al. | |
| 2007/0057316 A1 | 3/2007 | Yaegashi | |

FOREIGN PATENT DOCUMENTS

| JP | 2000-12863 A | 1/2000 |
|---|---|---|
| JP | 2000-311992 | 11/2000 |

OTHER PUBLICATIONS

U.S. Appl. No. 12/117,231, filed May 8, 2008, Nagano.
U.S. Appl. No. 12/125,546, filed May 22, 2008, Matsunaga et al.

* cited by examiner

*Primary Examiner*—Jerome Jackson, Jr.
*Assistant Examiner*—Paul A Budd
(74) *Attorney, Agent, or Firm*—Oblon, Spivak, McClelland, Maier & Neustadt, L.L.P.

(57) ABSTRACT

A semiconductor device includes a gate insulating film formed on a semiconductor substrate, a first gate electrode formed on the gate insulating film, a second gate electrode formed on the gate insulating film between the first gate electrode and a contact plug, a first silicon oxide film formed above the substrate between the first and second gate electrodes, a first silicon nitride film formed along the substrate and a side surface of the second gate electrode between the contact plug and the second gate electrode, a second silicon oxide film formed on the first silicon oxide film, the first gate electrode and the second gate electrode, the second silicon oxide film including an upper surface having a height greater than the height of a first upper surface of the first gate electrode relative to the substrate, and a second silicon nitride film formed on the second silicon oxide film.

9 Claims, 8 Drawing Sheets

SEMICONDUCTOR DEVICE

CROSS-REFERENCE TO RELATED APPLICATIONS

This application is based upon and claims the benefit of priority from the prior Japanese Patent Application No. 2006-254385, filed on, Sep. 20, 2006 the entire contents of which are incorporated herein by reference.

FIELD

The present disclosure is directed to a semiconductor device having an insulating film filled between gate electrodes of memory cell transistors and a method of manufacturing such semiconductor device.

BACKGROUND

A typical example of a semiconductor device having inter-electrode gaps of its memory cell transistors filled with insulating films is a NAND flash memory. Each memory cell transistor of the NAND flash memory is provided with control gate electrodes constituting the word line connecting the cells. Conventionally, a silicon oxide film and a silicon nitride film which is required in the backend steps are formed on the sidewalls of the word line. Further, interlayer insulating films are filled between the word lines. The above described configuration is described in JP 2000-311992 A, for example.

Further integration of design rules in integrated semiconductor circuits has discouraged employment of the above described configuration in view of the following respects. Narrower gaps between the word lines connecting the gate electrodes causes increase in the coupling capacitance between the adjacent memory cell transistors. Increased coupling capacitance becomes a problem especially when the insulating film filled between the word lines has high dielectric constant. Such being the case, it is difficult to employ a configuration that forms silicon nitride film having higher dielectric constant than the silicon oxide film on the sidewalls of the word line as described in the aforementioned document.

On the other hand, growing integration has reached a point where the level of resistance of the silicide formed on the upper portion of the gate electrode impose adverse effect on the device characteristics and conventional materials such as tungsten silicide (WSi) are no longer effective in such configuration. It has been known that alternative use of materials such as cobalt silicide ($CoSi_2$) provides satisfactory characteristics as far as resistance is concerned.

Employing cobalt silicide as a gate electrode of a memory cell involves a step requiring low temperature processing to be performed in the backend step. Thus, a step is introduced to render partial silicidation of the upper portion of the gate electrode after etching the gate electrode. Hence, a cobalt film for silicide formation is initially formed (primarily by sputtering process) on the upper surface of the polycrystalline silicon film, the polycrystalline silicon film constituting the gate electrode being isolated to form the gate electrode. Thermal processing is subsequently performed to cause the aforementioned silicide alloying reaction. In order to ensure the silicide reaction of the polycrystalline silicon by the cobalt film to take place, a wet treatment such as DHF (dilute HF) is conventionally introduced for the purpose of cleaning the surface of the polycrystalline silicon film.

Also, when introducing a process using copper (Cu) as a metal interconnect, in the backend step of the silicide forming step, a silicon nitride film, for example, effective in preventing intrusion of Cu is disposed as a barrier film between the gate electrodes and metal interconnects in order to prevent intrusion of Cu into the active regions of the memory cell, and the like.

However, introduction of wet treatment involving the use of DHF, and the like, for cleaning the surface of the polycrystalline silicon film in turn causes the following deficiencies. Firstly, in case interlayer insulating films such as a silicon oxide film filling the inter-electrode gaps (recess) are formed, the wet treatment etches back the interlayer insulating film. On the other hand, when filling the inter-gate electrode gap having high aspect ratio with a silicon oxide film, seams are prone to occur in the silicon oxide film. Thus when the seams are exposed by etch back, a wet treatment performed under such state causes introduction of etching liquid into the seams, consequently progressing the etch and resulting in voids.

Occurrence of cavities or voids allows intrusion of the silicon nitride film formed as a barrier film in the backend process and the higher dielectric constant of silicon nitride film relative to silicon oxide film causes adverse effects such as increase in parasitic capacitance between the cells. Also, intrusion of silicon nitride film between the word lines cause deficiencies such as application of electric potential on the word line from the select gate which has relatively high voltage applied to it.

SUMMARY

The present disclosure provides a semiconductor device that involves alloying cobalt silicide after gate electrode formation and that prevents increase in inter-electrode coupling capacitance even when employing a configuration having a barrier insulating film. The present disclosure also provides a method of manufacturing such semiconductor device.

The method of manufacturing a semiconductor device includes forming a plurality of gate electrodes for a plurality of memory cell transistors on a surface of a semiconductor substrate, each gate electrode including a polycrystalline layer on an upper portion thereof; filling a first silicon oxide film between the plurality of gate electrodes; exposing the polycrystalline layers; depositing a metal layer on the polycrystalline layers; alloying the metal layer with the polycrystalline layers to form silicide layers and removing a remainder metal layer unused as the silicide layer; forming a second silicon oxide film on and between the gate electrodes, an upper surface of the second silicon oxide film being higher than an upper surface of the gate electrode in regions over the gate electrodes and regions between the gate electrodes; and forming a silicon nitride film on the second silicon oxide film.

The semiconductor device of an embodiment includes a semiconductor substrate; a gate insulating film formed on the semiconductor substrate; a first gate electrode formed on the gate insulating film, the first gate electrode including a first upper surface and a first side surface; a contact plug formed on the semiconductor substrate; a second gate electrode formed on the gate insulating film between the first gate electrode and the contact plug, the second gate electrode including a second upper surface and a pair of second side surfaces, the second upper surface of the second gate electrode being equal to a height of the first upper surface of the first gate electrode relative to the semiconductor substrate, either one of the second side surfaces facing to the first side surface of the first gate electrode and the other second side surface facing to the contact plug; a first silicon oxide film formed above the semiconductor substrate between the first and second gate electrodes, the first silicon oxide film including a first upper end, the first upper end having a height smaller than the height of the first upper surface of the first gate electrode relative to the semiconductor substrate; a first silicon nitride film formed along the semiconductor substrate and the other of second side surface of the second gate electrode between the contact plug and the second gate electrode, the first silicon nitride film including a second upper end, the second upper end having a smaller height smaller than the first upper surface of the first gate electrode relative to the semiconductor substrate; a second silicon oxide film formed on the first silicon oxide film, the first gate electrode and the second gate electrode, the second silicon oxide film including a third upper surface having a height greater than the height of the first upper surface of the first gate electrode relative to the semiconductor substrate; and a second silicon nitride film formed on the second silicon oxide film.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

One embodiment employing the present disclosure to a NAND flash memory will be described with reference to the drawings. References are made to the drawings hereinafter with an identical or a similar reference symbol when referring to identical or similar elements. Of note is that the drawings are merely schematic and the relation between the thickness and the planar dimensions and the ratio in thickness of each layer differs from the actual ratio.

A description will be given on the configuration of the NAND flash memory of the present embodiment.

Figure 1:
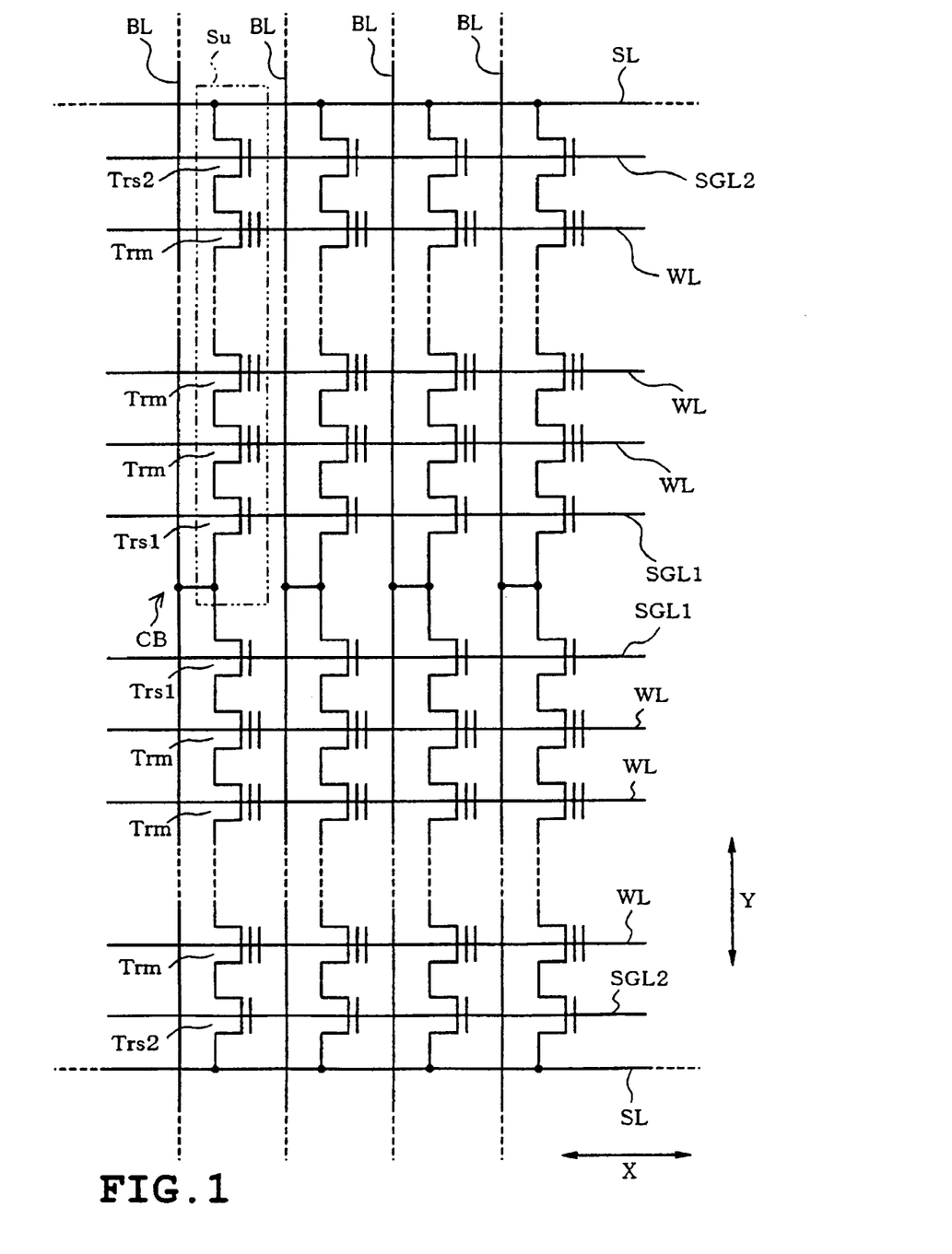
FIG. 1 illustrates an equivalent circuit showing a portion of the a memory cell array of a NAND type flash memory indicating a first embodiment of the present disclosure.

FIG. 1 illustrates an equivalent circuit of a portion of a memory cell array formed in the memory cell region of the NAND flash memory.

The memory cell array of the NAND flash memory is configured by a matrix of NAND cell units SU. The NAND cell unit SU is constituted by two select gate transistors Trs, and a plurality (eight for example: nth power of 2 (n is a positive integer)) of memory cell transistors Trm connected in series to the two select gate transistors Trs. The plurality of neighboring memory cell transistors Trm shares source/drain regions within a single NAND cell unit SU.

Referring to FIG. 1, the memory cell transistors Trm aligned in an X-direction (corresponding to word line direction and gate width direction) are connected to a common word line (control gate line) WL. Also, the select gate transistors Trs1 aligned in the X-direction in FIG. 1 are connected to a common select gate line SGL1. The select gate transistors Trs2 are connected to a common select gate line SGL2. A bit line contact CB is connected to a drain region of the select gate transistor Trs1. The bit line contact CB is connected to a bit line BL extending in the Y-direction (corresponding to the gate length direction and the bit line direction) perpendicularly intersecting the X-direction indicated in FIG. 1. The select gate transistor Trs2 is connected to a source line SL extending in the X direction of FIG. 1 via the source region.

Figure 2:
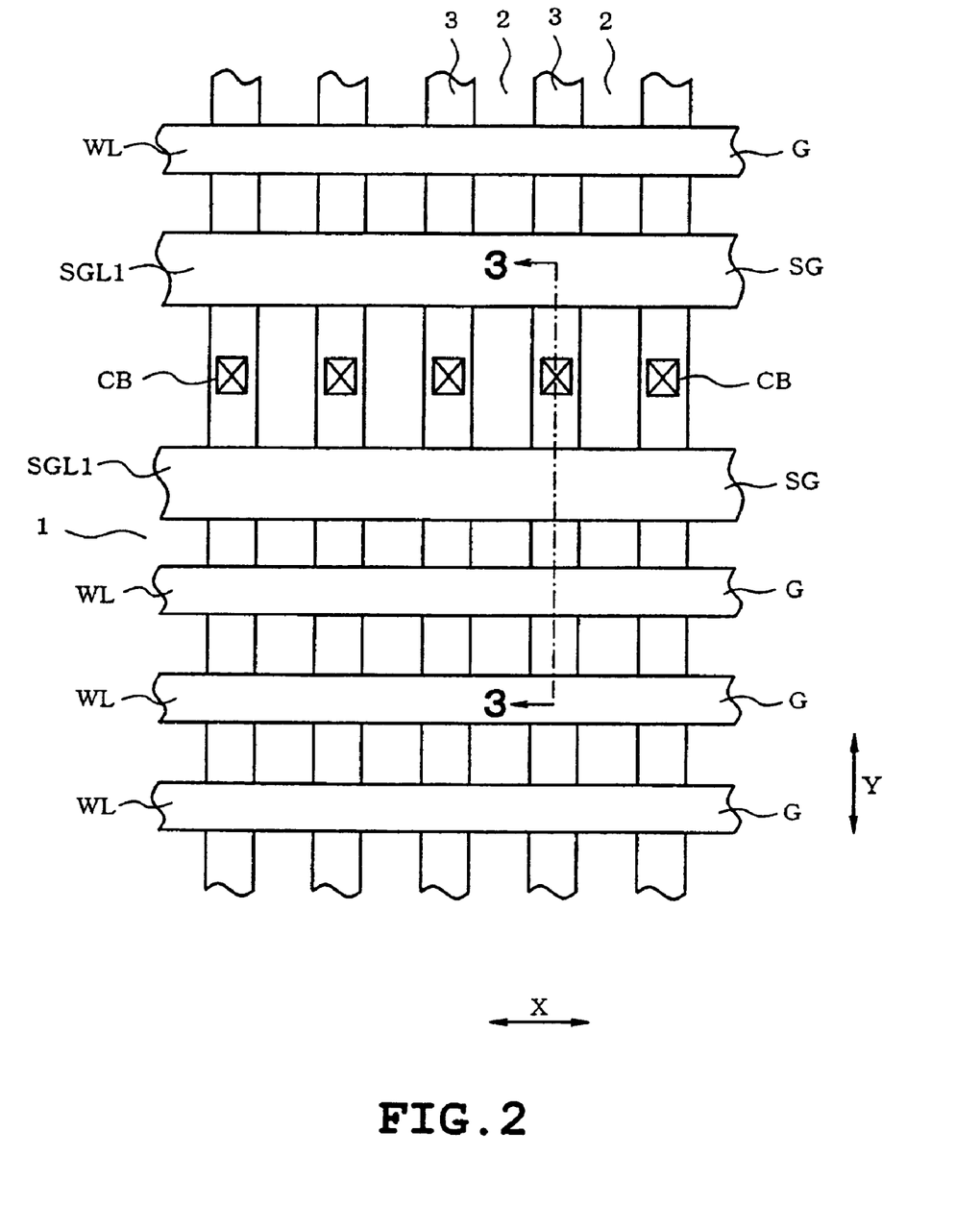
FIG. 2 is a schematic plan view indicating a layout of a portion of a memory cell region.

FIG. 2 is a plan view indicating a layout of a portion of the memory cell.

A plurality of STIs 2 (Shallow Trench Isolation) serving as an element isolation insulating region is formed at predetermined intervals along the Y-direction as viewed in FIG. 2 to form active regions 3 in the X-direction as viewed in FIG. 2. Word lines WL of memory cell transistors are formed at predetermined intervals along the X-direction as viewed in FIG. 2 perpendicular to the active region 3. Also, a select gate line SGL 1 of a pair of select gate transistors are formed along the X-direction as viewed in FIG. 2. The bit line contacts BL are formed in the active region 3 between the pair of select gate lines SGL1. A gate electrode G of the memory cell transistor is formed on the active region 3 intersecting the word line WL, and a gate electrode SG is formed on the active region 3 intersecting the select gate line SGL 1.

Figure 3:
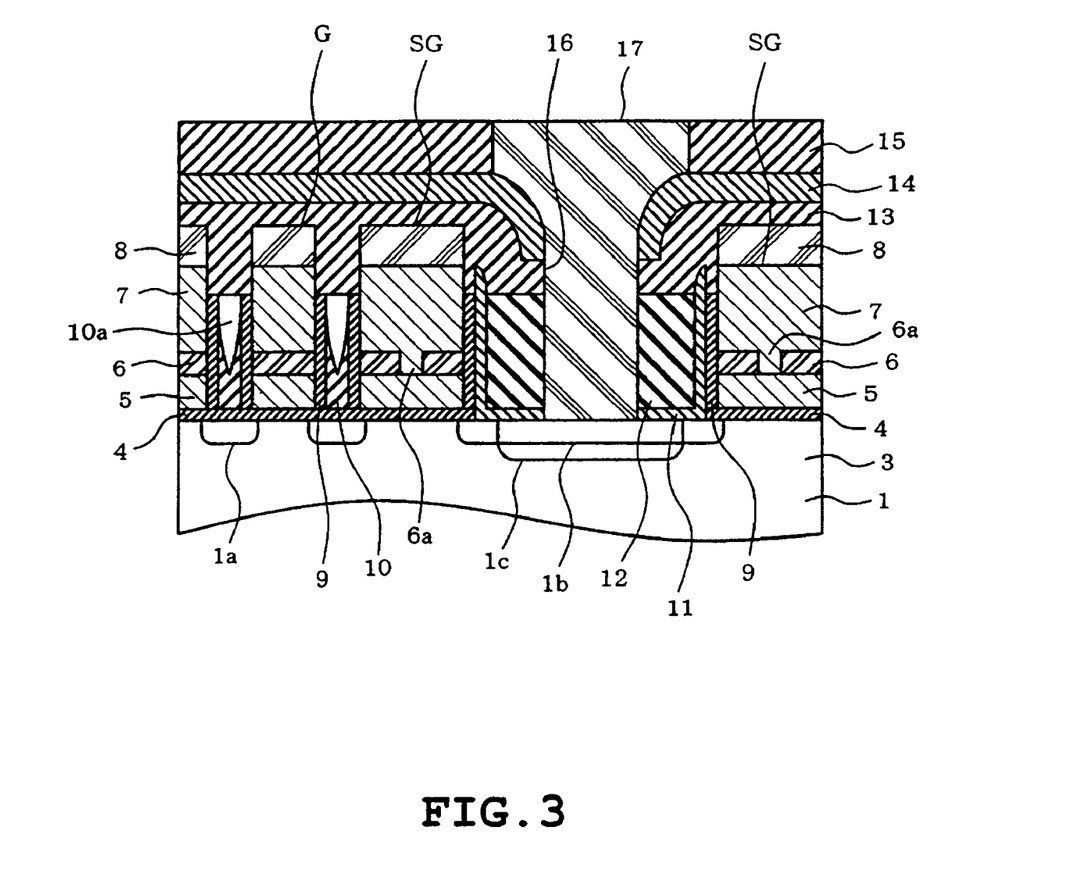
FIG. 3 is a cross sectional view of a portion taken along line 3-3 of FIG. 2.

FIG. 3 is a cross sectional view taken along line 3-3 of FIG. 2, illustrating a view centered on the gate electrode SG in the active area 3. In FIG. 3, the gate electrode G and the gate electrode SG formed on the silicon substrate 1 are configured in a laminated structure in which a tunnel insulating film 4, a polycrystalline silicon film 5 for a floating gate electrode, an inter-gate insulating film 6 composed of ONO (oxide-nitride-oxide) film, and the like, a polycrystalline silicon film 7 for control gate electrode and a cobalt silicide film 8 is laminated sequentially. The inter-gate insulating film 6 of the gate electrode SG has an opening 6a defined thereto to electrically connect the polycrystalline silicon film 5 to the polycrystalline silicon film 7, which opening 6a is filled with polycrystalline silicon film 7.

Formed on the sidewalls of the gate electrode G and the gate electrode SG is a silicon oxide film 9 by process such as RTP (rapid thermal processor) up to a predetermined height (a height covering approximately ⅔ of the sidewall of the polycrystalline silicon film 7 in FIG. 3) from the surface of the silicon substrate 1. A silicon oxide film 10 is formed by LP-CVD process between the silicon oxide films 9 of the gate electrode G and the silicon oxide film 9 of the gate electrode SG and the silicon oxide films 9 of the gate electrodes G. A void 10a has occurred in the silicon oxide film 10 by the later described manufacturing steps.

A silicon nitride film 11 is formed between a pair of gate electrodes SG across the surface where the silicon oxide films 9 confront each other and the surface of the silicon substrate 1. Further, silicon oxide film 12 such as BPSG (boron phosphorus silicate glass) film is formed so as to fill the inner side region of the silicon nitride film 11. The silicon nitride film 11 is formed into a shape having a portion protruding upward relative to the upper end portion of the silicon oxide film 9 in the later described step.

A TEOS (tetraethyl orthosilicate) film 13 is formed so as to cover the upper surface of the above described configuration, that is, the upper surfaces of the gate electrode G, the gate electrode SG and the intervening portions of the foregoing. The TEOS films 13 is formed so that its upper surface is formed in a position higher than the height of the cobalt silicide film 8 from the upper surface of the silicon substrate 1 in the region where the gate electrodes G and SG are formed, the region between the gate electrodes G, and the region between the gate electrode G and the gate electrode SG. In FIG. 3, the upper surface of the TEOS film 13 is planarized in the region where the gate electrodes G and SG are formed, the region between the gate electrodes G, and the region between the gate electrode G and the gate electrode SG; however, the upper surface of the TEOS film 13 may be convex-concave profile. A silicon nitride film 14 serving as a barrier film is formed on the TEOS film 13, and a TEOS film 15 is formed further thereon and planarized.

The upper surface of the TEOS film 13 is formed lower than the height of the upper surface of the cobalt silicide film 8 in the portion over the silicon oxide film 12 between the gate electrodes SG. According to this topography, the silicon nitride film 14 above the silicon oxide film 12 is also formed lower than the height of the upper surface cobalt silicide film 8. As shown, a contact hole 16 that reaches the surface of the silicon substrate 1 from the TEOS film 15 is defined in the silicon nitride film 12 forming region between the gate electrodes SG. The contact hole 16 penetrates the TEOS film 15, the silicon nitride film 14, the TEOS film 13, the silicon oxide film 12, and the silicon nitride film 11 so as to expose the surface of the silicon substrate 1. A contact plug 17 composed of a conductor is filled in the contact hole 16 to be electrically connected to the silicon substrate.

In the above described configuration, the silicon nitride film 14 serving as the barrier film is configured so as not to intrude between the gate electrodes G and between the gate electrodes G and SG, thereby preventing the increase in coupling capacitance between the cell transistors.

Next, the manufacturing steps to manufacture the above configuration will be described with reference to FIGS. 4 to 13.

Figure 4:
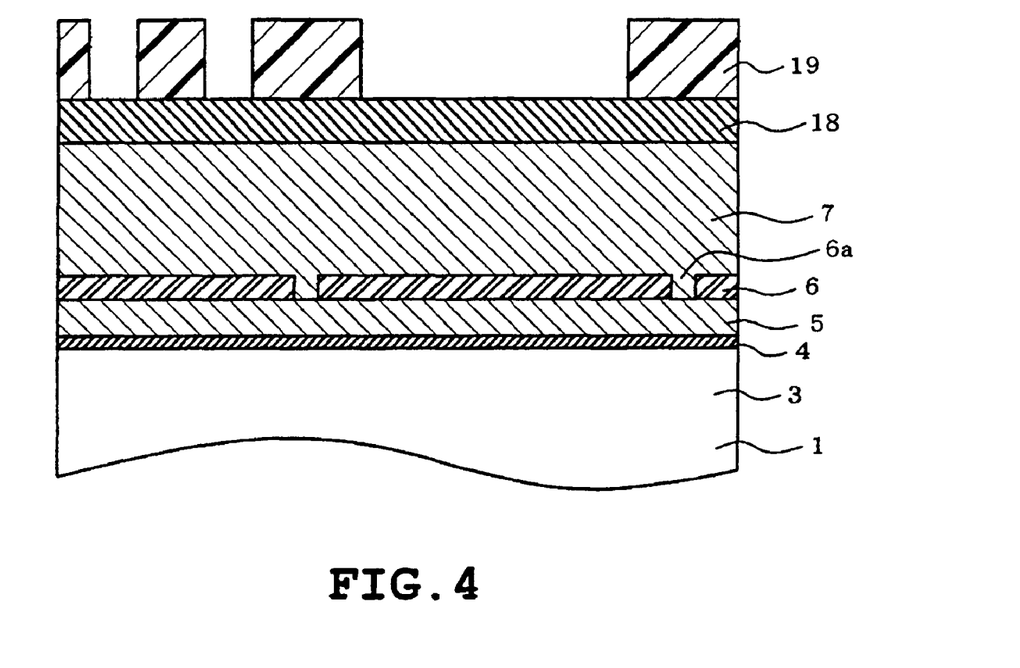
FIG. 4 is a schematic cross sectional view showing one phase of a manufacturing step.

Initially, as shown in FIG. 4, the tunnel insulating film 4 is formed on the silicon substrate 1, and thereafter the polycrystalline silicon film 5 constituting the floating gate, the inter-gate insulating film 6 and the polycrystalline silicon film 7 constituting the control gate (word line) are laminated. Further, the silicon nitride film 18 which serves as the hard mask in the dry etch process is laminated on the polycrystalline silicon film 7. Thereafter a resist 19 is coated by photolithography process to form a predetermined select gate and the word line pattern. After forming the inter-gate insulating film 6 on the polycrystalline silicon film 5, a portion of the inter-gate insulating film 6 in the gate electrode SG forming region is removed to define the opening 6a. After forming the polycrystalline silicon film 7 on the inter-gate insulating film 6, the polycrystalline silicon film 7 is filled in the opening 6a.

Figure 5:
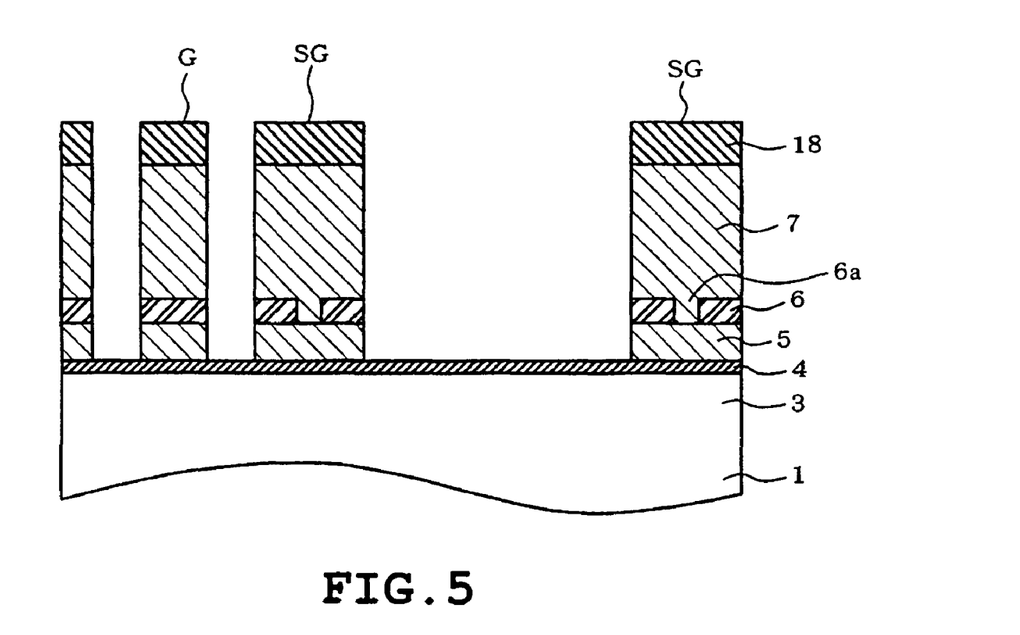
FIG. 5 is a schematic cross sectional view showing one phase of a manufacturing step ($2^{nd}$ variation)

Next, referring to FIG. 5, the patterned resist 19 is used as a mask to etch the silicon nitride film 18 by dry etching technique such as RIE (reactive ion etching), for example, and the silicon nitride film 18 in turn is used as a hard mask for subsequently etching the polycrystalline silicon film 7, the inter-gate insulating film 6, and the polycrystalline silicon film 5 to define a recess. The resist 19 is removed thereafter.

Figure 6:
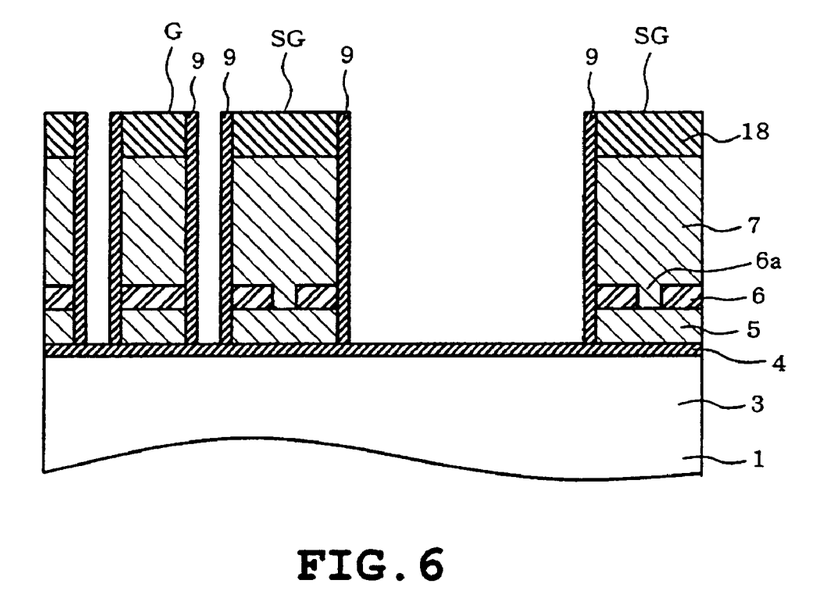
FIG. 6 is a schematic cross sectional view showing one phase of a manufacturing step ($3^{rd}$ variation)

Next, oxidation process is performed by using RTP, and the like. Thus, as shown in FIG. 6, the sidewalls of the polycrystalline silicon film 5 and 7 of the gate electrode G and the gate electrode SG are oxidized to form the silicon oxide film 9.

Figure 7:
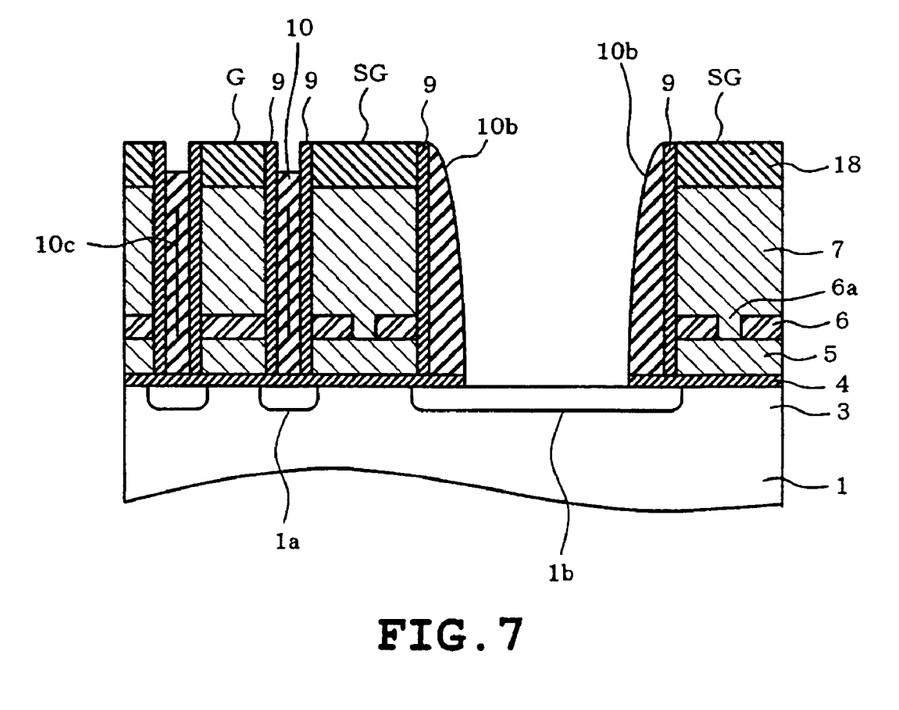
FIG. 7 is a schematic cross sectional view showing one phase of a manufacturing step ($4^{th}$ variation)

Next, as shown in FIG. 7, ion implantation process is performed for forming the diffusion layers 1a and 1b each corresponding to the source/drain regions of the memory cell transistor and the select gate transistor. Thereafter, approximately 50 nm of silicon oxide film 10 is formed by using LP-CVD (low pressure CVD) and thereafter the spacer 10b is formed by dry etch process. The silicon oxide film 10 is also formed in a narrow portion between the gate electrodes G and the gate electrodes G and SG. Since these portions have high aspect ratios, a seam 10c as shown is prone to occur between the gate electrodes G and between the gate electrodes G and SG when forming a silicon oxide film 10. Also, in the dry etch process, etch back occurs to a position slightly below the upper surface of the silicon nitride film 18, thus, most of the silicon oxide film 10 remains. Thereafter, impurity diffusion region 1c is formed by ion implantation in the portion between the gate electrodes SG by using the spacer 10b as a mask. Thus, LLD (lightly doped drain) structure is formed in the portion between the gate electrodes SG.

Figure 8:
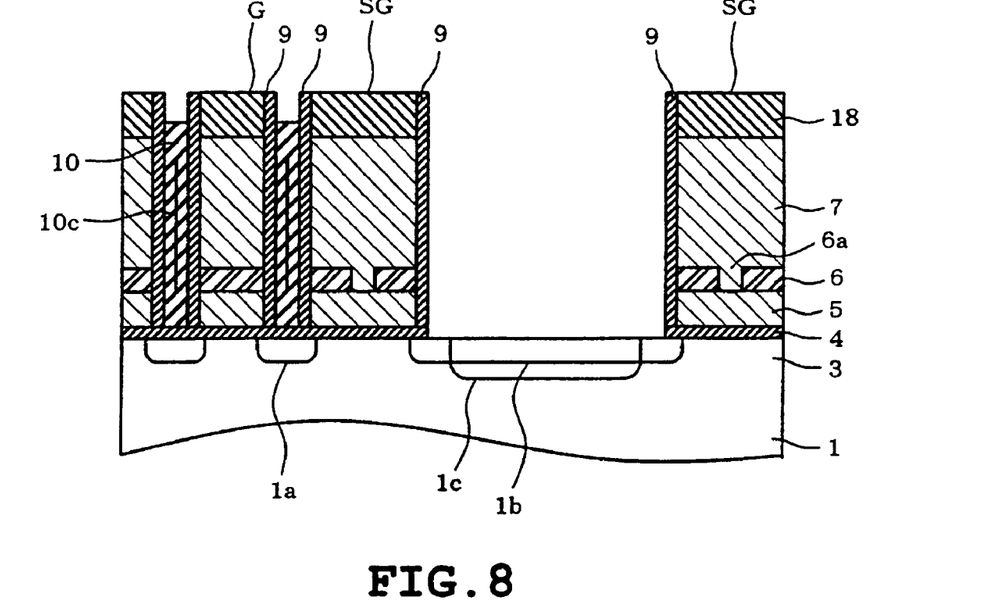
FIG. 8 is a schematic cross sectional view showing one phase of a manufacturing step ($5^{th}$ variation)

Next, referring to FIG. 8, only the regions between the gate electrodes SG are patterned to define an opening by lithography process, and the above described spacer 10b is removed by the above described chemical treatment using DHF-based chemicals.

Figure 9:
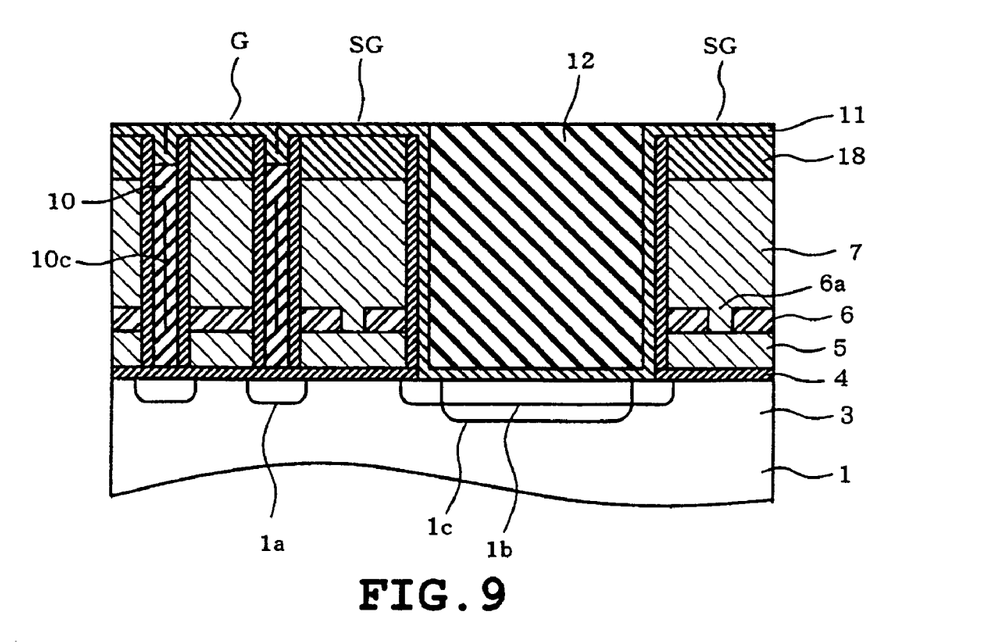
FIG. 9 is a schematic cross sectional view showing one phase of a manufacturing step ($6^{th}$ variation)

Subsequently, referring to FIG. 9, approximately 20 nm of silicon nitride film 11 is formed by LP-CVD process whereafter silicon oxide film 12 such as BPSG film is formed by CVD process. Then, melting treatment is carried out under high temperature wet oxidizing atmosphere and planarization is performed thereafter. In the planarization process, the silicon oxide film 12 is removed by CMP (chemical mechanical polishing) process for example, by using the silicon nitride film 11 as a stopper.

Figure 10:
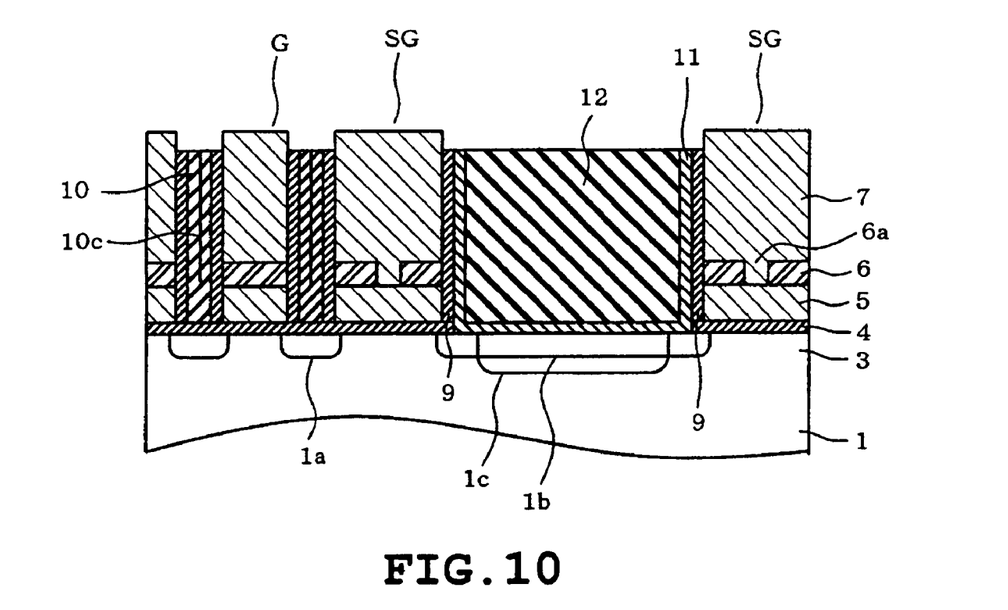
FIG. 10 is a schematic cross sectional view showing one phase of a manufacturing step ($7^{th}$ variation)
Figure 11:
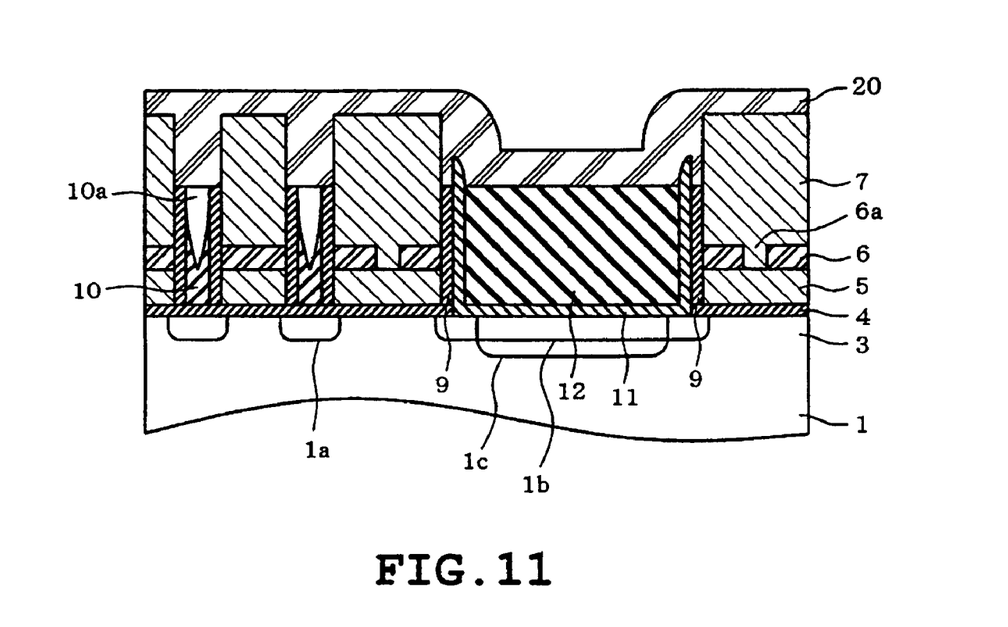
FIG. 11 is a schematic cross sectional view showing one phase of a manufacturing step ($8^{th}$ variation)

Next, referring to FIG. 10, the silicon nitride film 11 and the silicon oxide film 12 are etched by RIE process to expose the upper portion of the upper surface and the side surface of the polycrystalline silicon film 7 of the gate electrode G and SG. Thereafter, as shown in FIG. 11, the polycrystalline silicon film 7 constituting the control gate is cleaned by removing a natural oxide film, and the like, overlying the polycrystalline silicon film 7 by a removing technique such as DHF treatment. Then, the cobalt film 20 for silicide formation is formed by sputtering technique.

When etching the silicon oxide film 9 by the above RIE after removing the silicon nitride film 11, the surface of the silicon oxide film 10 formed in the portion (recess) between the gate electrode G and the gate electrode SG having high aspect ratio is exposed, at which point seams 10c may be exposed. Thus, the etch process may progress rapidly in the portions where the seams 10c are exposed in the subsequent wet process for removing the oxide film to form voids 10a shown in FIG. 10.

Figure 12:
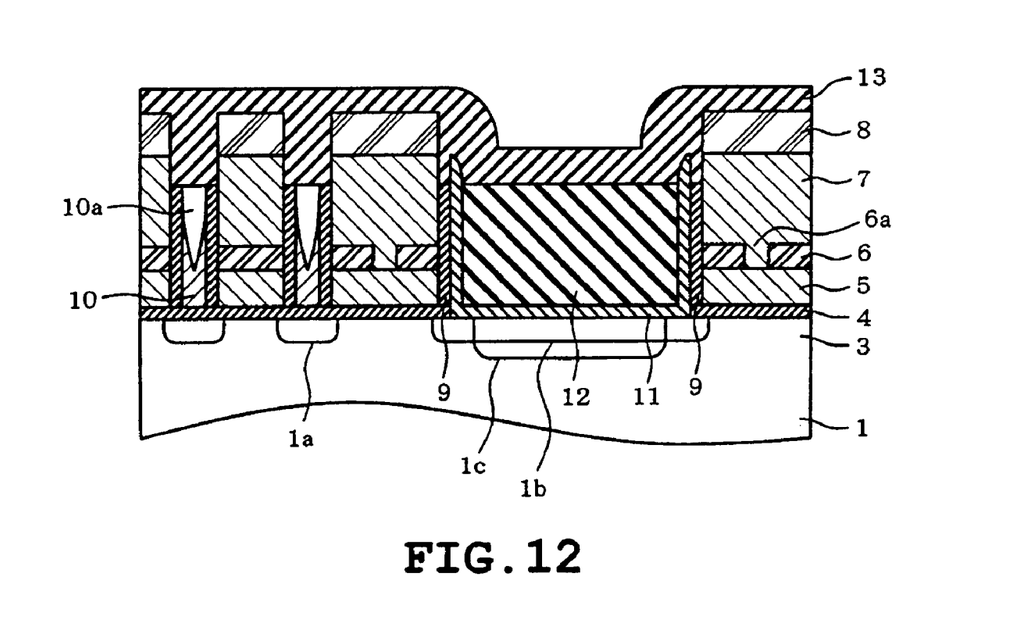
FIG. 12 is a schematic cross sectional view showing one phase of a manufacturing step ($9^{th}$ h variation)

Next, referring to FIG. 12, the cobalt silicide 8 is formed by annealing the cobalt film 20 deposited for silicide formation. The anneal process is carried out by lamp annealing techniques such as RTP. Only the portion of the cobalt film 20 contacting the polycrystalline silicon 7 is silicided and other portions remain non-reactive. Such non-reactive portions are removed by a chemical remover. Thereafter, the cobalt silicide film 8 is stabilized by annealing process such as RTP as required. Then, approximately 50 nm of TEOS film 13 is formed by LP-CVD process. The upper surface of the TEOS film 13 is formed so as to be higher than the height of the upper surface of the cobalt silicide film 8 from the silicon substrate 1 in the region where the gate electrodes G and SG are formed, the region between the gate electrodes G, and the region between the gate electrodes G and the gate electrodes SG. Contrastingly, the upper surface of the TEOS film 13 is formed so as to be lower than the upper surface of the cobalt silicide film in the portion above the silicon oxide film 12 between the gate electrode SG and the gate electrode SG.

Figure 13:
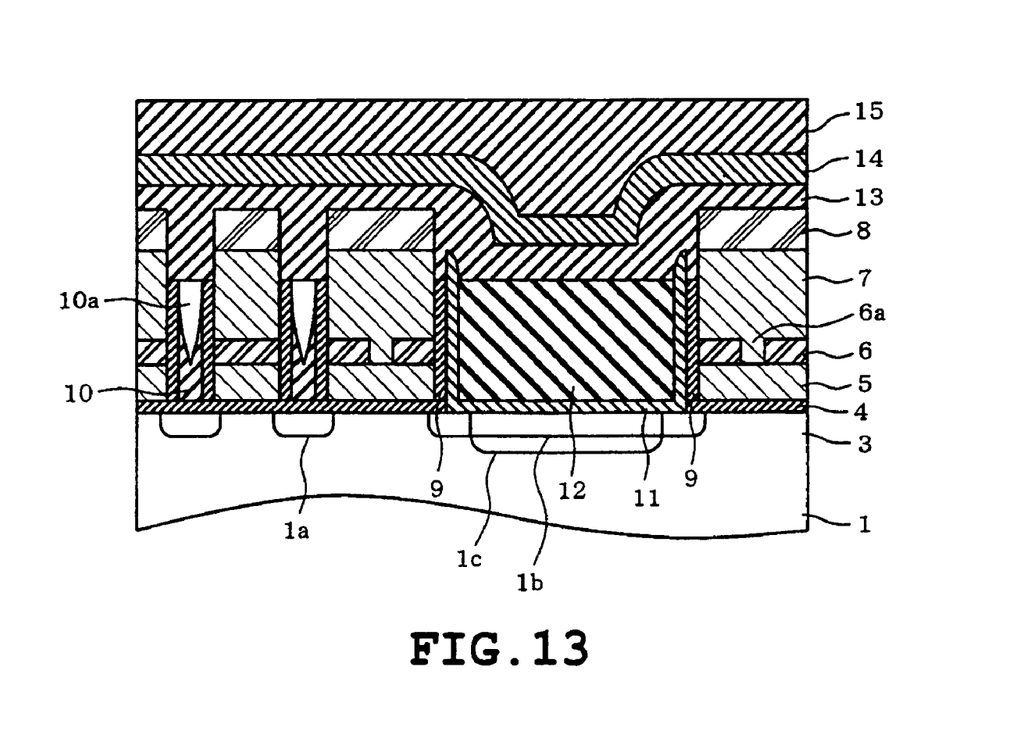
FIG. 13 is a schematic cross sectional view showing one phase of a manufacturing step ($10^{th}$ variation).

Then, referring to FIG. 13, approximately 30 nm of silicon nitride film 14 is formed as a barrier insulating film by LP-CVD technique and 400 nm of TEOS film 15 is further formed by CVD technique. Thereafter, the TEOS film 15 is planarized. Then, as illustrated in FIG. 1, the contact hole 16 is patterned for formation of contact plug therein constituting the bit line contact by photolithography process. The contact hole 16 penetrating the TEOS film 15, the silicon nitride film 14, the TEOS film 13, the silicon oxide film 12, and the silicon nitride film 11 is defined so as to expose the surface of the silicon substrate 1, and a conductor is filled in the contact hole 16 to form the contact plug 17. From hereafter, a multi-interconnect process not shown for the overlying layers ensues.

According to the present embodiment, the silicon nitride film serving as the barrier insulating film can be physically prevented from intruding between the gate electrodes G and between the gate electrodes G and SG by forming the silicon oxide film 13, thereby eliminating deficiencies such as increase in inter-line capacitance and electrical leakage between the gate electrode G and the gate electrode SG.

The present disclosure is not limited to the above described embodiment but may be modified or expanded as follows.

The present embodiment employs cobalt silicide film 8 for formation of the gate electrode G of the memory cell, however, tungsten silicide (SiW) film and other metal gate films may be used instead. The silicon oxide film 13 overlying the electrodes should be formed by different methods depending upon required tolerance to heat. LP-CVD has been employed in the present disclosure however plasma CVD may be used in a lower temperature process.

The thickness of the silicon oxide film overlying the electrodes only needs to be equal to or greater than 50% of the spacing between the neighboring word lines of the memory cell. By principle, film thickness equal to or greater than 50% of the spacing between the neighboring wordlines will fully fill the gaps without fail.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A semiconductor device, comprising:
   a semiconductor substrate;
   a gate insulating film formed on the semiconductor substrate;
   a first gate electrode formed on the gate insulating film, the first gate electrode including a first upper surface and a first side surface;
   a contact plug formed on the semiconductor substrate;
   a second gate electrode formed on the gate insulating film between the first gate electrode and the contact plug, the second gate electrode including a second upper surface and a pair of second side surfaces, the second upper surface of the second gate electrode being equal to a height of the first upper surface of the first gate electrode relative to the semiconductor substrate, either one of the second side surfaces facing to the first side surface of the first gate electrode and the other second side surface facing to the contact plug;
   a first silicon oxide film formed above the semiconductor substrate between the first and second gate electrodes, the first silicon oxide film including a first upper end, the first upper end having a height smaller than the height of the first upper surface of the first gate electrode relative to the semiconductor substrate;
   a first silicon nitride film formed along the semiconductor substrate and the other of second side surface of the second gate electrode between the contact plug and the second gate electrode, the first silicon nitride film including a second upper end, the second upper end having a smaller height smaller than the first upper surface of the first gate electrode relative to the semiconductor substrate;
   a second silicon oxide film formed on the first silicon oxide film, the first gate electrode and the second gate electrode, the second silicon oxide film including a third upper surface having a height greater than the height of the first upper surface of the first gate electrode relative to the semiconductor substrate; and
   a second silicon nitride film formed on the second silicon oxide film.

2. The device of claim 1, wherein each of the first and second gate electrodes includes a silicide layer at a gate upper portion.

3. The device of claim 2, wherein the silicide layer comprises a cobalt silicide film.

4. The device of claim 2, wherein the silicide layer includes a lower end having a height equal to the height of the second upper end of the first silicon nitride film relative to the semiconductor substrate.

5. The device of claim 1, wherein the first gate electrode includes a floating gate electrode of a memory cell transistor.

6. The device of claim 1, further comprising a word line connected to the first gate electrode.

7. The device of claim 1, further comprising a select gate line connected to the second gate electrode.

8. The device of claim 1, further comprising a void located between the first and second gate electrodes.

9. The device of claim 8, wherein the void is located in the first silicon oxide film.

* * * * *